(12) United States Patent
Somayajula et al.

(10) Patent No.: US 8,912,798 B2
(45) Date of Patent: Dec. 16, 2014

(54) CIRCUIT FOR CONTROLLING CURRENT TO LIGHT-EMITTING DIODE (LED)

(75) Inventors: Shyam Somayajula, Bangalore (IN);
Nageswara Nalam, Bangalore (IN);
Arnold James Dsouza, Bangalore (IN);
Ankit Seedher, Bangalore (IN)

(73) Assignee: ST-Ericsson SA, Plan-les-Ouates (CH)

( * ) Notice: Subject to any disclaimer, the term of this patent is extended or adjusted under 35 U.S.C. 154(b) by 214 days.

(21) Appl. No.: 13/516,578

(22) PCT Filed: Dec. 10, 2010

(86) PCT No.: PCT/EP2010/069374
§ 371 (c)(1),
(2), (4) Date: Aug. 21, 2012

(87) PCT Pub. No.: WO2011/073096
PCT Pub. Date: Jun. 23, 2011

(65) Prior Publication Data
US 2012/0306502 A1    Dec. 6, 2012

(30) Foreign Application Priority Data
Dec. 16, 2009  (IN) .............. 2630/DEL/2009

(51) Int. Cl.
*G01R 31/00* (2006.01)
*G01R 31/02* (2006.01)
*H05B 33/08* (2006.01)
*G01R 31/26* (2014.01)

(52) U.S. Cl.
CPC .......... *G01R 31/024* (2013.01); *H05B 33/0893* (2013.01); *G01R 31/2635* (2013.01)
USPC ................ 324/414; 361/2; 361/189

(58) Field of Classification Search
USPC .................. 324/414–424, 500, 520–525; 361/103–106, 87, 24
See application file for complete search history.

(56) References Cited

U.S. PATENT DOCUMENTS

| | | | |
|---|---|---|---|
| 8,067,896 B2 * | 11/2011 | Shteynberg et al. | .......... 315/247 |
| 2004/0036418 A1 | 2/2004 | Rooke et al. | |
| 2007/0267978 A1 | 11/2007 | Shteynberg et al. | |

FOREIGN PATENT DOCUMENTS

WO  2008120143 A2  10/2008

\* cited by examiner

*Primary Examiner* — Melissa Koval
*Assistant Examiner* — Trung Nguyen
(74) *Attorney, Agent, or Firm* — Coats and Bennett, PLLC (57) ABSTRACT

A current controlling circuit comprises a DC power source, an inductor, a N-channel Metal Oxide Semiconductor (NMOS), one or more LEDs connected in series, a first resistor and a switching arrangement. The positive terminal of the DC power source is connected to the inductor in series. The series of LED is connected in series with the inductor and the first resistor. According to an embodiment the switching arrangement comprises a second resistor, a first switch and a second switch. The second resistor is connected in series with the second switch and connected in parallel with the first switch. The switching arrangement is connected in series with the first resistor and the negative terminal of the DC supply.

9 Claims, 8 Drawing Sheets

CIRCUIT FOR CONTROLLING CURRENT TO LIGHT-EMITTING DIODE (LED)

CROSS-REFERENCE TO RELATED APPLICATIONS

This application is the National Stage of International App. No. PCT/EP2010/069374, filed Dec. 10, 2010, which claims priority to Indian Patent App. No. 2630/DEL/2009, filed Dec. 16, 2009, and which are hereby incorporated by reference as if fully set forth herein.

BACKGROUND OF THE INVENTION

1. Field of the Invention

The present invention relates generally to a detection circuit and more particularly, to a circuit for detecting an Open/Shorted LED conditions in an electrical circuit.

2. Description of the Related Art

Electrical circuits generally have one or more load components connected in series or parallel with a current source and with various other components in the circuit. Fault in one or more load components may result in change in the voltage drop across other component of the circuit. Such faults may results in damage of one or more active or passive components of the circuit. One such fault condition is Open/Shorted load conditions.

In an electrical circuit, the open load condition is a condition where the output current is less than a predetermined minimum current. Further, the shorted load condition is a condition where the output current is more than a predetermined minimum current. The shorted load condition results in increased load current, which may cause damage to active or passive components of the circuit. A number of methods and circuits are known to determine an open load or shorted load conditions.

However, such method and circuits has to be implemented using at least two different circuits for measuring Shorted and Open load conditions separately. Therefore, results in a complex and bulky circuit. Such circuits generally occupy large space and are not preferred considering the modern day technology of integrated circuits.

Further, considering the transfer characteristics of the loads such as resistive loads, the detection of open/shorted conditions of such loads is generally not feasible, hence the accurate detection is not obtained. However, for loads such as LEDs, controlling average current through the LEDs and the detection of open/shorted LED condition in a circuit is feasible since the intensity of lightening is proportional to the average current flowing through the LEDs. Further, the characteristic of diodes is that above the cut-in voltage, the incremental resistance is very small, and hence makes the detection of open/shorted LED condition feasible. One such implementation is illustrated according to the FIG. 1 of the present invention.

Figure 1:
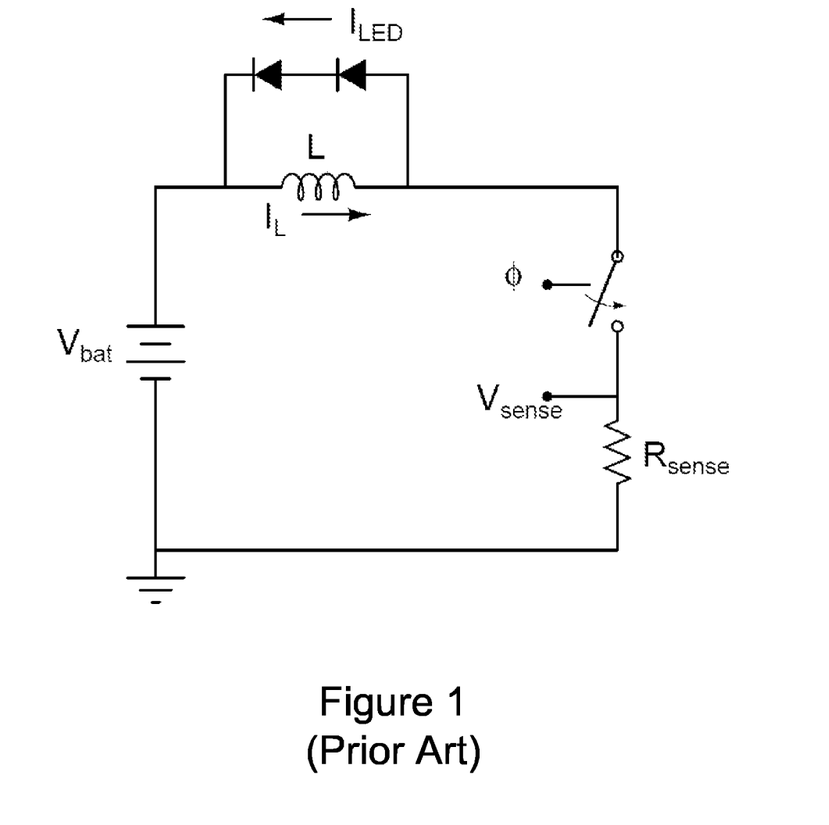
FIG. 1 illustrates a conventional circuit of controlling current flowing through a LED.

As illustrated in FIG. 1, a conventional electrical circuit is disclosed, wherein the circuit comprises a battery, an inductor and one or more LED and a sensing resistor. The inductor is connected in parallel to the LED's and the battery (power source) provides the DC voltage $V_{bat}$. The negative terminal of the battery is connected to the ground and the positive terminal is connected to the inductor and the cathode terminal of LED's. The sensing resistor is in series with the parallel circuit elements and a sensing voltage can be obtained across the sensing resistor. The current control action in this conventional circuit further employs a variable switching signal 'Φ' that operates a switch to connect the parallel circuit elements to the sensing resistance. However, the circuit fails to identify the faulty condition such as an open LED or shorted LED.

Hence, there is a well-felt need for an embedded circuit, which is capable of detecting an open/Shorted LED conditions at the output of any electronic circuit.

SUMMARY OF THE INVENTION

It is a principal object of the present invention to provide a method and a circuit for detecting an Open/Shorted LED conditions in an electronic circuit.

Accordingly, the present invention discloses a detection circuit for detecting an open/shorted LED condition in an electrical circuit. According to an embodiment of the present invention, the detection circuit comprises a first terminal and a second terminal. The first terminal is connected to a first resistor $R_{sense}$. The circuit further comprises a switching arrangement connected in series with the first resistor $R_{sense}$. The switching arrangement comprises of a second resistor $(R_{slt})$, a first switch and a second switch. The second resistor $(R_{slt})$ is in series with the second switch and in parallel with the first switch. The second terminal is connected in series with the switching arrangement and the first resistor $R_{sense}$.

According to yet another embodiment of the present invention, a circuit is provided for controlling current to LED's with open/shorted LED condition detection. The circuit comprises a boost converter, one or more LEDs connected to the boost converter and the detection circuit at the output terminal for detecting the Open/Shorted LED conditions.

According to yet another embodiment, a present invention discloses a method for detecting an open and shorted LED in an circuit having one or more LED, a first resistor $R_{sense}$, a second resistor $R_{slt}$ and a switching circuit, wherein for performing a shorted LED test, the switching circuit is so operated to connect the first resistor $R_{sense}$ and second resistor $R_{slt}$ in series with one or more LEDs. Further for performing open LED test, the switching circuit is so operated to connect only the first resistor $R_{sense}$ in series with one or more LEDs.

BRIEF DESCRIPTION OF THE DRAWINGS

To further clarify the above and other advantages and features of the present invention, a more particular description of the invention will be rendered by reference to specific embodiments thereof, which is illustrated in the appended drawings. It is appreciated that these drawings depict only typical embodiments of the invention and are therefore not to be considered limiting of its scope. The invention will be described and explained with additional specificity and detail with the accompanying drawings in which.

DETAILED DESCRIPTION OF THE DRAWINGS

Figure 2A:
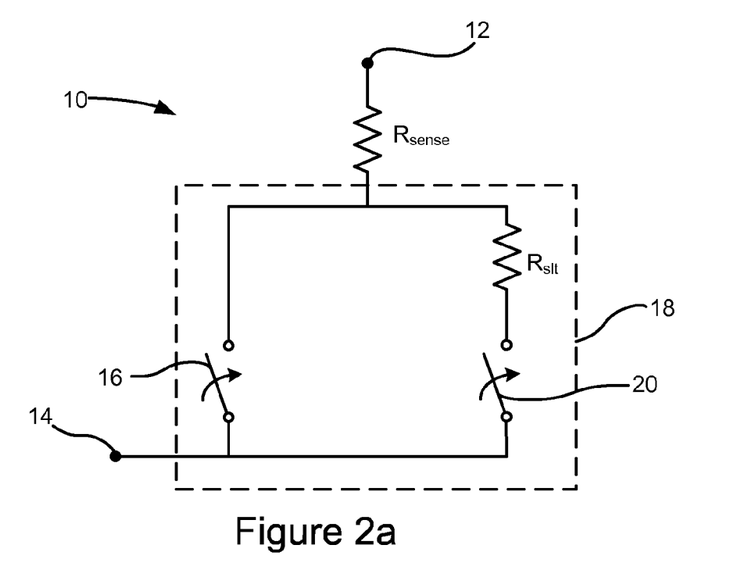
FIG. 2a illustrates a detection circuit according to an embodiment of the present invention.

Turning now to FIG. 2a that illustrates a detection circuit 10 according to an embodiment of the present invention. The detection circuit 10 comprises a first terminal 12, a second terminal 14, a first resistor $R_{sense}$ and a switching arrangement 18. The first terminal 12 is connected to the first resistor $R_{sense}$. The switching arrangement 18 comprises a second resistor $R_{slt}$ and at least two switches, a first switch 16 and a second switch 20. The second resistor $R_{slt}$ is connected in parallel with the first switch 16 and IS connected in series with the second switch 20. The switching arrangement 18 IS connected in series with the first resistor $R_{sense}$. The second terminal 14 is connected in series with the switching arrangement 18. The detection circuit 10 may be used for detecting an Open/Shorted LED conditions in a circuit having one or more LEDs and a DC power supply.

Figure 2B:
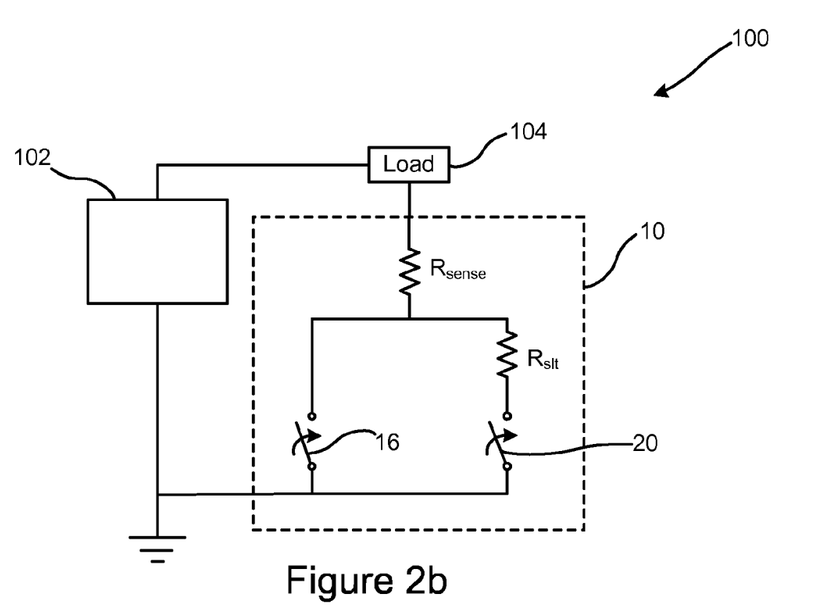
FIG. 2b illustrates a current controlling circuit according to an embodiment of the present invention.

FIG. 2b illustrates a preferred embodiment of the present invention wherein the detection circuit 10 is employed in a current controlling circuit 100 having one or more load component 104. The disclosed current controlling circuit 100 comprises a boost converter 102, one or more load components 104 and the detection circuit 10 connected in series. The boost converter 102 provides a constant current to the load 104. According to an embodiment, the load 104 may be one or more LEDs. According to yet another embodiment of the present invention, the boost converter 102 comprises a DC voltage supply, an energy transferring element and a controlling switch connected in series. According to an embodiment, the energy-transferring element may be an Inductor. According to yet another embodiment, the detection circuit 10 may be implemented on-chip.

According to yet another embodiment of the present invention, the first switch 16, the second switch 20 and the controlling switch may be selected from a group of MOS devices, BJT transistor etc.

Figure 3:
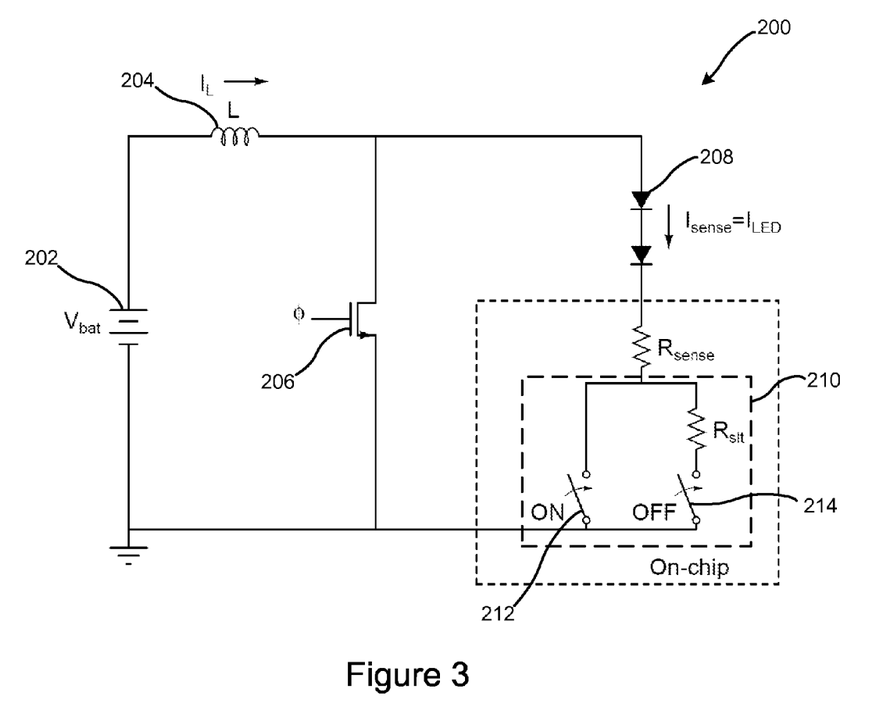
FIG. 3 illustrates a current controlling circuit according to another embodiment of the present invention.

FIG. 3 illustrates a specific embodiment of the circuit 200, wherein the circuit 200 comprises a DC power source 202, an inductor 204, a N-channel Metal Oxide Semiconductor (NMOS) 206, one or more LEDs 208 connected in series, a first resistor $R_{sense}$ and a switching arrangement 210. According to an embodiment, the DC power source 202, the inductor 204, the N-channel Metal Oxide Semiconductor (NMOS) 206 are connected in series. The positive terminal of the DC power source 202 is connected to the inductor 204 and the negative terminal of the DC power source 202 is grounded. The drain terminal of the NMOS 206 is connected to the inductor 204 and the source terminal of the NMOS 206 is connected to the ground. Further, a series of LED 208 is connected in series with the inductor 204 and the first resistor $R_{sense}$.

According to an embodiment the switching arrangement 210 comprises a second resistor $R_{slt}$, a first switch 212 and a second switch 214. The second resistor $R_{slt}$ is connected in series with the second switch 214 and connected in parallel with the first switch 212. The switching arrangement 210 is connected in series with the first resistor $R_{sense}$ and the negative terminal of the DC supply 202.

The current control circuit employs a switching signal Φ fed to the gate terminal of the NMOS 206. It may be appreciated by a person skilled in the art that NMOS 206 starts conducting (or is switched 'on') when the gate-to-source voltage ($V_{GS}$) exceeds the threshold voltage $V_{th}$ of the NMOS 206. The current through one or more LEDs 208 is controlled by controlling the duty cycle of the switching signal Φ (the gate-to-source voltage ($V_{GS}$)) fed to the gate terminal of NMOS 206.

According to an embodiment of the invention, the NMOS 206 is turned ON for some time and then turned OFF. During the ON state of the NMOS 206, inductor current $I_L$ builds up linearly. This inductor current $I_L$ will flow through the LEDs 208 when the NMOS 206 is turned OFF. It may be appreciated by a person skilled in the art that the current through an inductor 204 cannot change instantaneously. The inductor current $I_L$ results in a sensing voltage ($V_{sense}$) greater than the reference voltage (i.e. $V_{sense} > V_{ref\_open}$).

Figure 4:
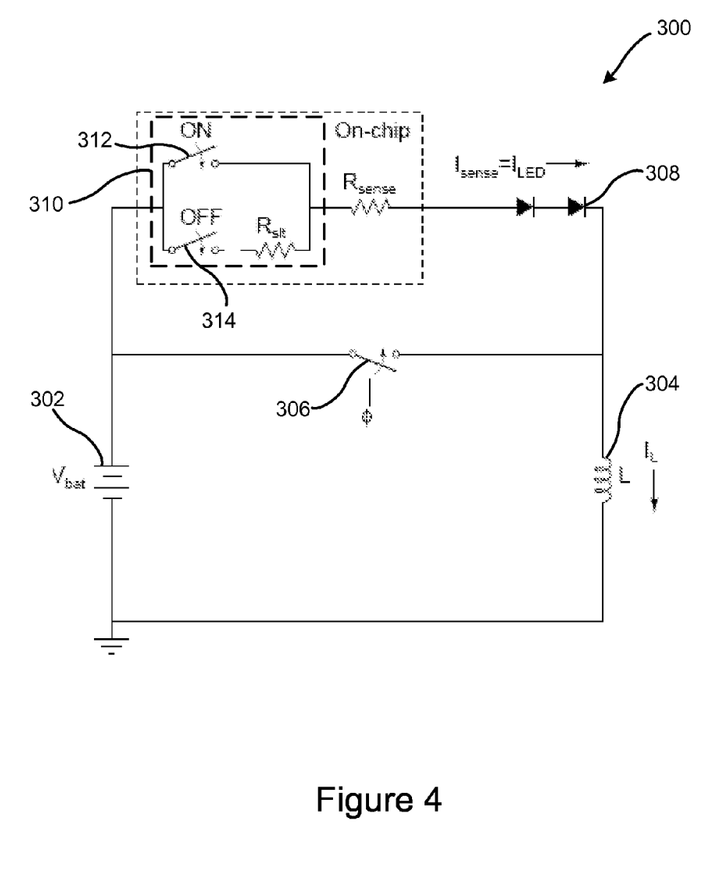
FIG. 4 illustrates a current controlling circuit according to yet another embodiment of the present invention.

FIG. 4 illustrates a current controlling circuit according to yet another embodiment of the present invention, wherein the circuit comprises a DC power source 302, an inductor 304, a controlling switch 306, one or more LEDs 308, a first resistor $R_{sense}$, and a switching arrangement 310. According to an embodiment, the DC power source 302, the inductor 304 and the controlling switch 306 are connected in series. The positive terminal of the DC power source 302 is connected to first end of the controlling switch 306 and the negative terminal of the DC power source 302 is grounded. A first end of the inductor 304 is connected to the second end of the controlling switch 306 and a second end of the inductor 304 is grounded. According to an embodiment, the controlling switch 306 can be selected from a group of MOS devices, BJT etc.

According to an embodiment of the present invention, the switching arrangement 310 comprises a second resistor $R_{slt}$, a first switch 312 and a second switch 314. The second resistor $R_{slt}$ is connected in series with the second switch 314 and connected in parallel with the first switch 312. The switching arrangement 310 is connected in series with the positive terminal of the DC power source 302 and with the first resistor $R_{sense}$. The first resistor $R_{sense}$ is connected in series with at least one LED 308 that in turn connected to the first end of the inductor 304.

According to an embodiment of the present invention a comparator may be provided with the current controlling circuits as illustrated in FIGS. 2b, 3 and 4 for detecting an open and shorted condition of the LEDs. The inverting terminal of the comparator may be fed with the voltage across the resistors ($R_{sense} + R_{slt}$) and the non-inverting terminal may be fed with the reference voltage $V_{ref}$. As may be appreciated by a person ordinarily skilled in the art, a LED may malfunction or be shorted due to various circuit conditions or large current flow. The circuit arrangement enables testing or detection of Open/shorted LED by providing a high or low signal at the comparator output.

Figure 5:
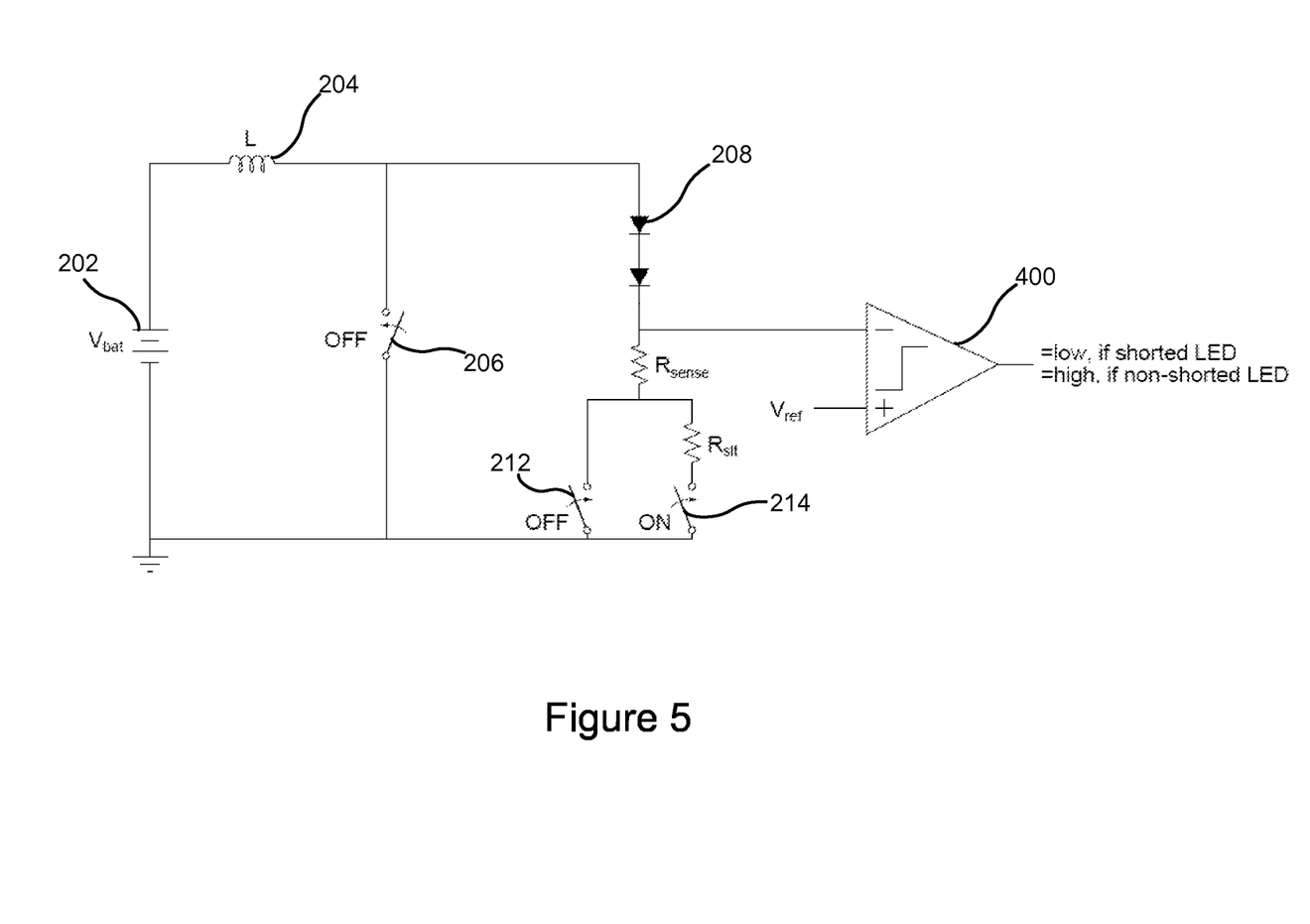
FIG. 5 illustrates a circuit arrangement for detection of an Open/Shorted LED conditions according to an embodiment of the present invention.

FIG. 5 illustrates implementation of a comparator 400 with a current controlling circuit 200 as disclosed in FIG. 3 according to an exemplary embodiment of the present invention for detection of an Open/Shorted LED conditions.

Figure 6A:
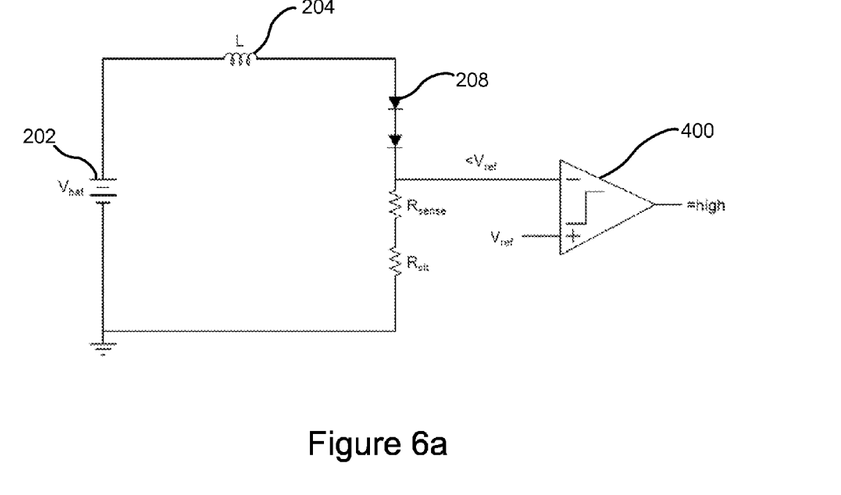
FIG. 6a illustrates an embodiment of circuit arrangement for performing shorted LED condition test when the LEDs are non-shorted.
Figure 6B:
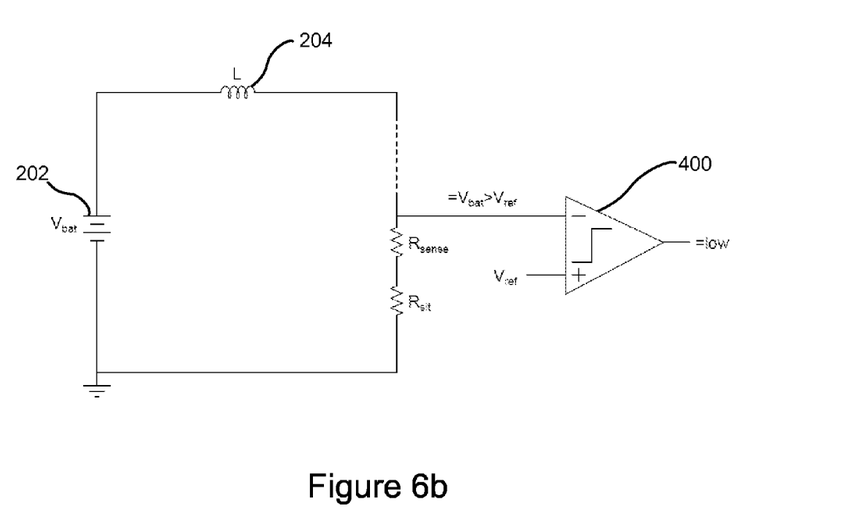
FIG. 6b illustrates an embodiment of circuit arrangement for shorted LED test when the LED is shorted.

FIG. 6a and FIG. 6b illustrates circuits derived from the circuit arrangement as shown in FIG. 5, for performing a non-shorted/shorted LED condition test respectively.

According to an embodiment, the switching arrangement 210 is so operated to turn OFF the first switch 212 and turn ON the second switch 214 thereby introducing the resistance $R_{slt}$ in series with the sense resistor $R_{sense}$. Subsequently, the voltage drop across the resistors ($R_{sense} + R_{slt}$) is compared with the reference voltage.

FIG. 6a illustrates the circuit arrangement for performing shorted LED condition test when the LEDs 208 are non-shorted. When the LEDs 208 are non-shorted, then a leakage current ($I_{leakage}$) flows through the $V_{bat}$–L–LED–$R_{sense}$–$R_{slt}$. The leakage current is such that:

$$(I_{leakage})*(R_{sense}+R_{slt})<V_{ref}(R_{sense}, R_{slt}, V_{ref} \text{ being chosen according to } I_{leakage})$$

Accordingly, the input signal at the inverting terminal of the comparator 400 is less than the input at non-inverting terminal ($V_{ref}$) and hence comparator output will be a positive. A positive output (high signal) indicates that LEDs 208 are non-shorted.

FIG. 6b illustrates a circuit arrangement for shorted LED test when all the LEDs 208 are shorted. When all the LEDs 208 are shorted, the leakage current ($I_{leakage}$) flows through the $V_{bat}$–L–$R_{sense}$–$R_{slt}$ path. The leakage current ($I_{leakage}$) is given by the following relation:

$$(I_{leakage})=V\text{bat}/(R_{sense}+R_{slt}), \text{ and}$$

$$(I_{leakage})*(R_{sense}+R_{slt})=V_{bat}(>V_{ref})$$

Accordingly, the input signal at the inverting terminal of the comparator 400 is greater than the input at non-inverting terminal ($V_{ref}$) and hence comparator output will be a negative (low). A negative output (low signal) indicates that all the LEDs 208 are shorted (faulty).

Figure 7A:
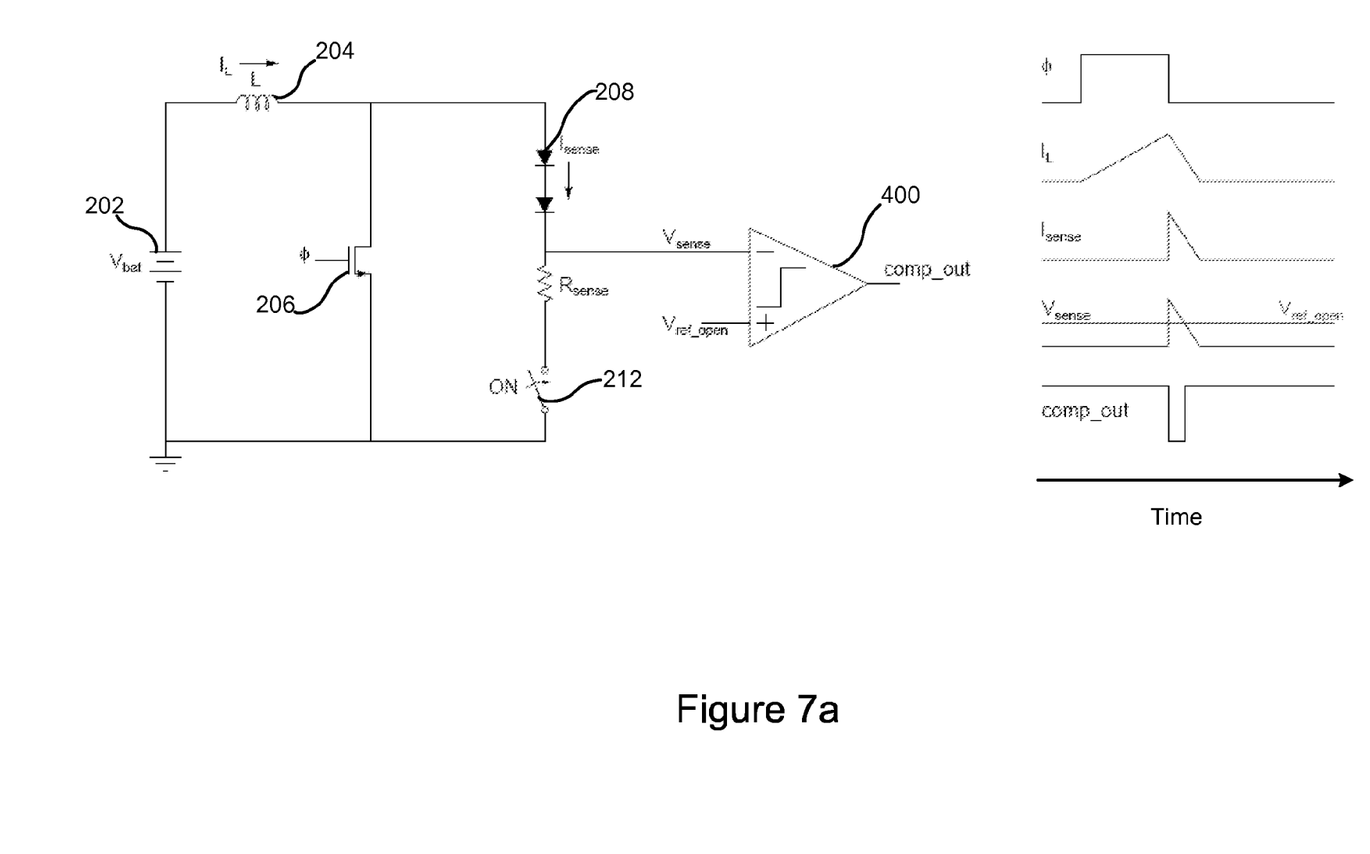
FIG. 7a illustrates an embodiment of circuit arrangement and associated waveforms for performing an open LED condition test when LED are non-open.
Figure 7B:
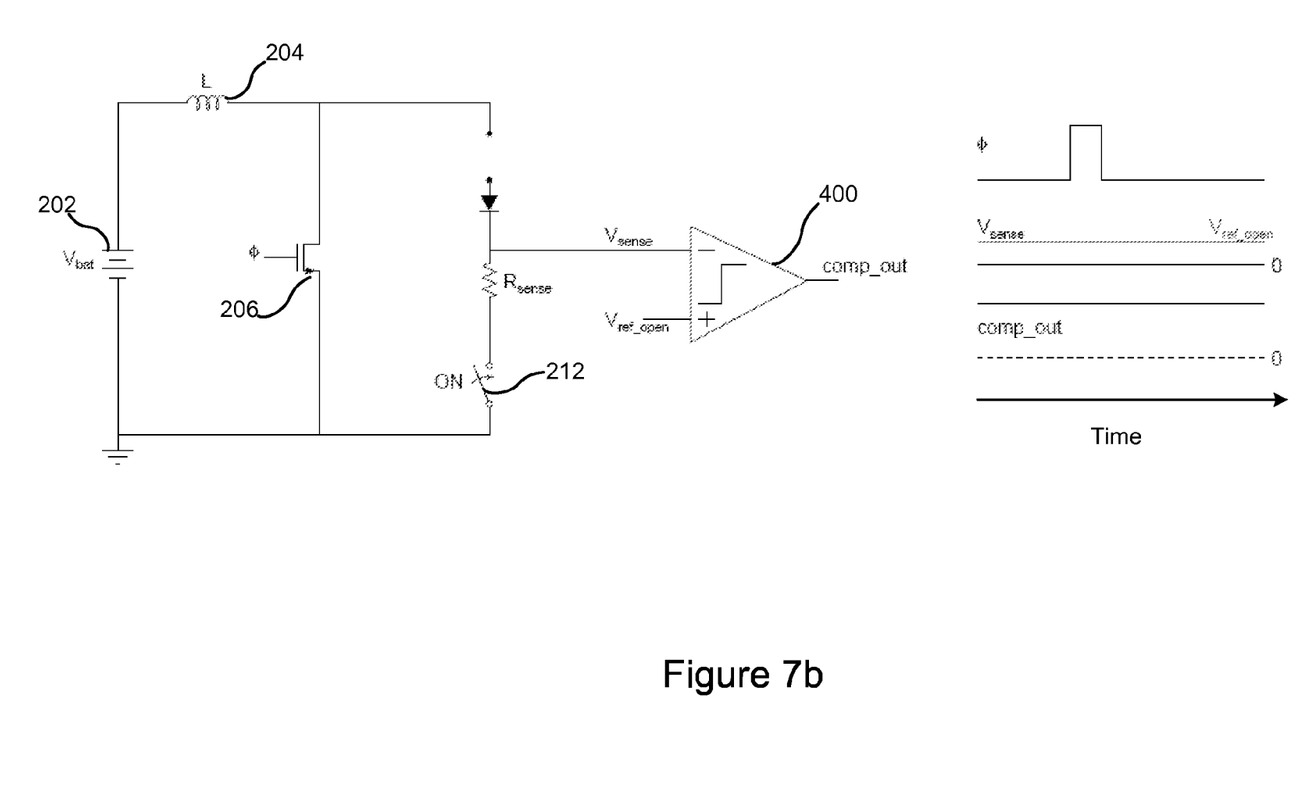
FIG. 7b illustrates an embodiment of circuit arrangement and associated waveforms for open LED test when the LEDs are open.

FIG. 7a and FIG. 7b illustrates a circuit derived from the circuit arrangement as shown in FIG. 5, for performing a non-open/open LED condition test respectively.

According to an embodiment, the switching arrangement 210 is so operated to turn ON the first switch 212 and turn OFF the second switch 214 thereby eliminating the resistance $R_{slt}$ in series with the sense resistor $R_{sense}$. Subsequently, the voltage drop across the $R_{sense}$ is compared with the reference voltage.

FIG. 7a illustrates an embodiment of circuit arrangement for performing an open LED condition test when none of the LEDs 208 are open. When none of the LEDs are open, the input signal at the inverting terminal of the comparator 400 is greater than the input at non-inverting terminal and hence comparator output will be a negative (low). The FIG. 7a further illustrates various waveforms for the switching signal (gate to source voltage 'Φ', the inductor current $I_L$, sensing current $I_{sense}$, sensing voltage $V_{sense}$, and comparator output.

FIG. 7b illustrates an embodiment of circuit arrangement and associated waveforms for open LED test when one or more LEDs 208 are open. When one or more LEDs 208 are open, the inductor current $I_L$ results will not result in a voltage ($V_{sense}$) greater than the reference voltage (i.e. $V_{sense}< V_{ref—open}$). Accordingly, the input signal at the inverting terminal of the comparator 400 is less than the input at non-inverting terminal and hence comparator output will be a positive (high). A positive output (high signal) indicates that at least one of the LED 208 is open. FIG. 7b further illustrates various waveforms for the switching signal (gate to source voltage 'Φ', the inductor current $I_L$, sensing current $I_{sense}$, sensing voltage $V_{sense}$, and comparator output.

The disclosed invention has the advantage that the series switch protects the inductor from burning out. In addition, the discharge of the DC power source (battery) is prevented.

It is to be appreciated that the subject matter of the claims are not limited to the various examples and language used to recite the principle of the invention, and variants can be contemplated for implementing the claims without deviating from the scope. Rather, the embodiments of the invention encompass both structural and functional equivalents thereof.

While certain present preferred embodiments of the invention and certain present preferred methods of practicing the same have been illustrated and described herein, it is to be distinctly understood that the invention is not limited thereto but may be otherwise variously embodied and practiced within the scope of the following claims.

We claim:

1. A detection circuit for detecting an open and shorted Light Emitting Diode (LED) condition in a device, the circuit comprising:
    a first terminal, the first terminal being connected to a first resistor;
    a switching arrangement connected in series with the first resistor; and
    a second terminal being connected to the switching arrangement such that the switching arrangement and the first resistor is connected in series between the second and first terminals, wherein the switching arrangement comprises a second resistor, a first switch and a second switch, the second resistor is in series with the second switch and the arrangement of the second resistor and the second switch is in parallel with the first switch, and wherein the switching arrangement is operative such that the first switch is in OFF state and the second switch is in ON state to perform a shorted LED condition test or the first switch is in ON state and the second switch is in OFF state to perform an open LED condition test.

2. The circuit of claim 1, wherein the switches comprise MOSFET switches or BJT switches.

3. A circuit for controlling current to one or more Light Emitting Diodes (LEDs) with open/shorted LED condition detection, the circuit comprising:
    a DC supply having positive and negative terminals;
    an energy-transferring element connected in series with the positive terminal of the DC supply;
    at least one LED connected in series with the energy transferring element; and
    a detection circuit connected between the at least one LED and the negative terminal of the DC supply, the detection circuit comprising
        a first terminal, the first terminal being connected to a first resistor;
        a switching arrangement connected in series with the first resistor; and
        a second terminal being connected to the switching arrangement such that the switching arrangement and the first resistor is connected in series between the second and first terminals, wherein the switching arrangement comprises a second resistor, a first switch and a second switch, the second resistor is in series with the second switch and the arrangement of the second resistor and the second switch is in parallel with the first switch, and wherein the switching arrangement is operative such that the first switch is in OFF state and the second switch is in ON state to perform a shorted LED condition test or the first switch is in ON state and the second switch is in OFF state to perform an open LED condition test.

4. The circuit of claim 3, wherein the energy-transferring element is coupled to a controlling switch, wherein the controlling switch is operative to control the energy transfer from the energy-transferring element to at least one LED.

5. The circuit of claim 3, further comprising a comparator, wherein a noninverting terminal of the comparator is connected to a reference voltage and an inverting terminal of the comparator is connected to sense a voltage drop across the resistors.

6. The circuit of claim 3, wherein the energy-transferring element is an inductor.

7. A method for detecting an open and shorted Light Emitting Diode (LED) condition in a circuit having one or more LEDs, a first resistor, a second resistor, and a switching circuit, comprising:
   for performing a shorted LED condition test, operating the switching circuit to connect the first resistor and second resistor in series with one or more LEDs; and
   for performing an open LED condition test, operating the switching circuit to connect only the first resistor in series with one or more LEDs.

8. The method of claim 7, further comprising;
   comparing a reference voltage with the voltage across the first resistor and the second resistor; and
   outputting an signal indicative of a shorted LED condition.

9. The method of claim 7, further comprising;
   comparing a reference voltage with the voltage across only the first resistor; and
   outputting an signal indicative of an open LED condition.

* * * * *